United States Patent [19]

Jones et al.

[11] 4,014,014
[45] Mar. 22, 1977

[54] SYNCHRONIZED MULTISPEED TRANSDUCER POSITION INDICATING SYSTEM

[75] Inventors: Donald H. Jones, Pittsburgh; Paul F. McNally, Gibsonia, both of Pa.

[73] Assignee: Contraves-Goerz Corporation, Pittsburgh, Pa.

[22] Filed: June 6, 1975

[21] Appl. No.: 584,376

[52] U.S. Cl. .................. 340/347 SY; 340/347 AD
[51] Int. Cl.² ....................................... H03K 13/02
[58] Field of Search ............ 235/92 R; 340/347 SY, 340/347 P, 347 AD; 318/632, 603, 652–661, 592, 594

[56] References Cited

UNITED STATES PATENTS

| | | | |
|---|---|---|---|
| 2,980,900 | 4/1961 | Rabin | 340/347 SY |
| 2,991,462 | 7/1961 | Hose | 340/347 SY |
| 3,223,830 | 12/1965 | Evans | 340/347 SY |
| 3,277,461 | 10/1966 | Selvin | 340/347 SY |
| 3,315,253 | 4/1967 | Geller | 340/347 SY |
| 3,493,960 | 2/1970 | Doyle | 340/347 SY |
| 3,529,136 | 9/1970 | Offereins | 340/347 AD |
| 3,855,585 | 12/1974 | Stout | 340/347 AD |

*Primary Examiner*—Charles D. Miller
*Attorney, Agent, or Firm*—Robert D. Yeager; Howard G. Massung

[57] ABSTRACT

A method and apparatus for synchronizing the digitized position output of a multispeed system having overlapping position indications. The output of the multispeed position indicating system is a digital output word which is a combination of the individual outputs of the various transducers. For a two speed system a digital fine position having a high degree of accuracy is provided, and a digital coarse position indication of a lesser precision is also provided wherein the least significant coarse position digit overlaps the most significant fine position digit. An adjustment is provided for adjusting the coarse digital output as a function of the most significant digit of the fine transducer output so that nonambiguous synchronized position information is provided at all times. The appropriate adjustment can be obtained by adding a fixed number of counts, such as 5, to the coarse digital position indication and then subtracting the most significant digit of the fine position indication so that when the coarse position indication is combined with the fine position indication the desired unambiguous output results. The combined position indication can be obtained by utilizing all of the fine digital position outputs and the coarse digital outputs other than the least significant digit, which overlaps the most significant digit of the fine digital output. The coarse and fine position indicators can be resolvers which are connected to the shaft to be instrumented. The outputs of these resolvers are then converted to digital signals by analog to digital converters. The fine digital signal and the modified coarse digital signal are then combined by appropriate logic.

11 Claims, 2 Drawing Figures

PRIOR ART

SYNCHRONIZED MULTISPEED TRANSDUCER POSITION INDICATING SYSTEM

BACKGROUND OF THE INVENTION

1. Field of the Invention

This invention relates to a multispeed transducer system; and, more particularly, to a position indicating system having both a coarse and fine position transducer for indicating position over a large range.

2. Description of the Prior Art

In order to provide information over a multiple number of revolutions or electrical cycles and to know precisely which revolution or cycle is being monitored, a multispeed transducer system must be employed. In a two speed transducer system, a fine transducer is used for indicating the position of the instrumented shaft within the revolution being observed and a coarse transducer is provided to determine which revolution or cycle is being checked.

Two speed transducer systems are well known in the art. They have been widely used to provide electrical instrumentation for the determination of the position of a rotary shaft in applications where information is needed as to absolute shaft position over multiple revolutions. A typical system wherein the positions sensors are resolvers consists of two resolves mechanically interconnected by a speed reducer. The rotary shaft to be instrumented can be directly coupled to the fine resolver to mechanically provide input angle data representing the angular position of the shaft. The fine resolver, which is directly coupled to the shaft, is used to provide electrical signals over any given single revolution of the shaft indicating the angular orientation with a high degree of accuracy. By an appropriate gear reduction mechanism or by the differential reduction technique, as described more fully in copending CSR application ser. No. 504,431, the coarse resolver is caused to provide electrical signals which indicate the total number of revolutions of the shaft being instrumented. The combination of the fine resolver and coarse resolver can thus provide electrical signals indicating the absolute position of the instrumented shaft over multiple revolutions. The outputs of the coarse and fine resolvers can then be converted to a digital word.

It has been recognized in the prior art, for example, when the fine resolver data is a three-digit binary coded decimal word and the coarse resolver position is also a three-digit binary coded decimal word, the coarse signal can be made to overlap the fine by one full decade. That is, the least significant decade of the fine signal. This overlap allows for good synchronization between the coarse and the fine position word. However, as is common, a slight error or variation can occur between the coarse digital output and the fine digital output. This error can cause an ambiguity around the point at which the fine transducer completes a cycle. For example, for a three-decade binary coded decimal word, an ambiguity can exist near the point where the fine digital word changes from 999 to 000. When the fine digital word is combined with the coarse digital word, this small position error can result in a gross combined readout error. For proper operating, it is desirable that the combined output signal provide nonambiguous error free indications at all times.

When the term resolver is used herein it is intended to include: synchro, induction potentiometer, resolver, transmitter, control transformer, differential control transformer and any other sinusoidal position transducer.

SUMMARY OF THE INVENTION

A method and apparatus is provided which eliminates the readout error or ambiguity which can occur due to a small position error between the coarse and fine transducers in a multispeed transducer system. The teaching of this invention can readily be applied to systems involving many transducers which are utilized to cover as large a range as desired. The disclosed technique involves taking the output of the fine transducer and modifying the output of the next level coarse transducer so that the final displayed output is in synchronization with the overall position relative to the combined output of the coarse and fine transducer involved. The digital output of the first coarse transducer can be synchronized in the same manner with the next order coarse transducer so that the final overall digital position indication would involve the sum of the fine transducer and portions of all the modified coarse transducer outputs. The disclosed technique can be applied to any number of transducers ratioed together to provide an overall representation of a very large positioning range.

For example, in a typical two-speed positioning system utilizing the teaching of the present invention, a fine position indicator provides a high accuracy digital word indication of a position over a relatively small range and a coarse positioning means provides a lesser accuracy digital indication of a position over a larger range which includes the range covered by the fine position indicator. The fine position indicator and the coarse position indicator are constructed so that the most significant digit of the fine position indicator at the least significant digit of the coarse position indicator overlap. That is, during normal errorless operation the least significant coarse digit and the most significant fine digit should be exactly synchronized. However, as usually occurs, when a slight error exists between the coarse and fine position output, an ambiguity exists at the fine position indicator's transition points. According to the teachings of the present invention, an adjusting means is provided to modify the coarse position indication by a number of digital counts so that when a selected portion of the coarse digital output is combined with the fine digital output, a correct nonambiguous position indication is provided.

For example, for a multispeed positioning indicating system, wherein the coarse and fine position are indicated by three digit words, a constant number of counts can be added to the coarse digital word and from this can be subtracted the most significant digit to the fine digit word so that when the coarse output digits, other than the least significant digit, are combined with the fine digit output, a nonambiguous position indication results. An example of the technique is to shift the coarse output ahead by five counts; subtract the most significant digit of the fine output from the shifted coarse; and, combine the resultant coarse output with the actual fine output. This modified overlap technique will guarantee a nonambiguous combined output for situations wherein the error between the coarse and fine transducer is less than ten counts of the least significant coarse digit. The shifting of the coarse output may be accomplished by either physically displacing the coarse transducer by five counts or simply adding five counts to the coarse output.

It is an object of this invention to teach a method for overlapping a coarse and fine transducer digital output to provide a nonambiguous position indication over the entire instrumented range even when small errors exist between the coarse and fine position transducers.

BRIEF DESCRIPTION OF THE DRAWINGS

For a better understanding of the invention, reference may be had to the preferred embodiment exemplary of the invention shown in the accompanying drawings, in which.

DESCRIPTION OF THE PREFERRED EMBODIMENTS

Figure 1:
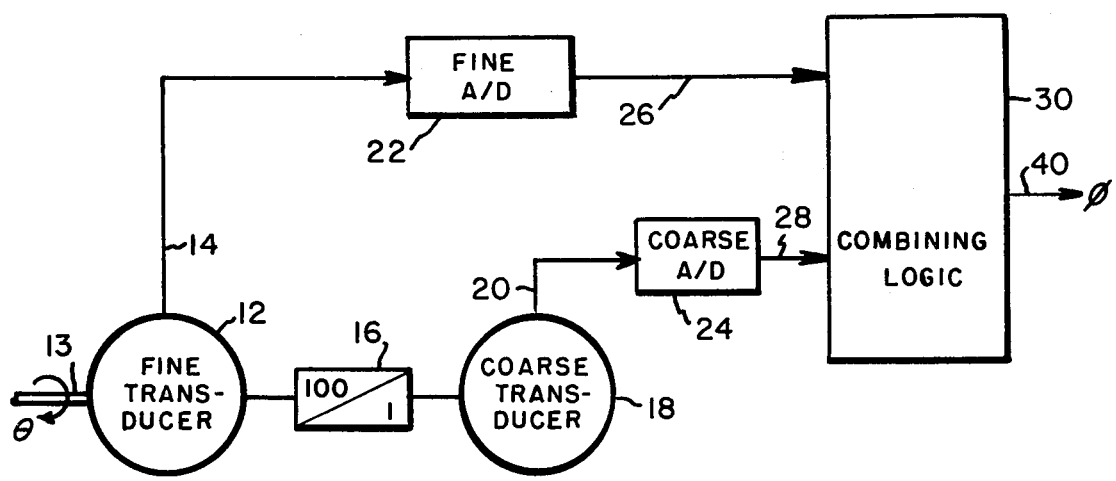
FIG. 1 is a view of prior art two-speed transducer systems.

Referring now to the drawings and FIG. 1 in particular, there is shown a prior art two-speed transducer system. The fine transducer 12 is connected to a shaft 13 which is rotated through an angle, $\theta$ which can be greater than 360°. Fine transducer 12, which can be a resolver, provides an analog output along line 14 which indicates the position of shaft 13 through one revolution. A speed reducer 16 can be connected between the shaft 13 and coarse transducer 18 so that coarse transducer 18, which can also be a resolver, provides a position which includes multiple revolutions of shaft 13. For example, for a twospeed resolver system as shown in FIG. 1 having a ratio between fine and coarse resolvers of 100:1, the shaft 13 to be instrumented can have a total movement of 100 revolutions while the coarse resolver rotates only one revolution. Thus, the resolver system provides nonambiguous information for total shaft travel of 100 revolutions. Thus for every revolution of the input shaft to fine transducer 12, the input shaft of coarse transducer 18 is rotated a fraction and an indication of the exact revolution is provided on line 20. Alternately, the fine and coarse transducer can be connected in a manner as disclosed in copending application Ser. No. 503,431 entitled TWO SPEED RESOLVER EMPLOYING DIFFERENTIAL REDUCTION TECHNIQUES to provide the same output along lines 14 and 20 for a selected revolution of the shaft 13. A fine analog to digital converter 22 is provided to yield a digitized output of the analog signal supplied by fine transducer 12 along line 14. A coarse analog to digital converter 24 is provided to yield a digital signal for the analog signal from coarse transducer 18 fed along line 20. A fine digital signal from analog to digital converter 22 is fed along line 26 to combining logic 30. A coarse digital signal is fed along line 28 from coarse analog to digital converter 24 to combining logic 30. A synchronized digital position output $\phi$ is then provided from combining the logic 30. Table I shows a combined overlapped output $\phi$ from the combining logic 30 when the fine transducer and coarse transducer are errorless.

TABLE I

| Digitized Coarse Output LINE 28 | Digitized Fine Output LINE 26 | Combined Overlapped Output $\phi$ LINE 40 |
|---|---|---|
| 999 | 995 | 99995 |
| 999 | 996 | 99996 |

TABLE I-continued

| Digitized Coarse Output LINE 28 | Digitized Fine Output LINE 26 | Combined Overlapped Output $\phi$ LINE 40 |
|---|---|---|
| 999 | 997 | 99997 |
| 999 | 998 | 99998 |
| 999 | 999 | 99999 |
| 000 | 000 | 00000 |
| 000 | 001 | 00001 |
| 000 | 002 | 00002 |
| 000 | 003 | 00003 |

Table I shows the output of a coarse and fine transducer wherein the reduction ratio between the coarse and fine transducer is 100:1. Table I shows a typical output which might be expected between a coarse and fine transducer in a system of this type when the overall output passes through a 0 position and the transducers are in effect perfect having no error. The least significant digit of the coarse digital signal is overlapped with the most significant digit of the fine digital signal. The combined output consists of the two most significant digits of the coarse digital signal and the three digits of the fine digital signal. In essence, for a perfectly matched system, the numerical value of the least significant coarse digit is identical to the most significant fine digit. This relationship is established by the 100:1 ratio between the fine transducer 12 and the coarse transducer 18 as shown in FIG. 1. For a perfect, error free system, the 999 to 000 transition in the coarse and fine transducers would occur at the exact same position. If, however, any error were to exist either in the transducers or the 100:1 reduction, the 999 to 000 transition of the fine and the 9 to 0 transition of the least significant coarse digit would not necessarily occur at the same position and an ambiguous situation would result. Table II shows a coarse digital output, a fine digital output and the combined overlapped digital output which occurs when a small position error exists.

TABLE II

| Digitized Coarse Output LINE 28 | Digitized Fine Output LINE 26 | Combined Overlapped Output $\phi$ LINE 40 | |
|---|---|---|---|
| 999 | 995 | 99995 | |
| 999 | 996 | 99996 | |
| 999 | 997 | 99997 | |
| 999 | 998 | 99998 | |
| 999 | 999 | 99999 | Ambiguous |
| 999 | 000 | 99000 | Error |
| 999 | 001 | 99001 | Situation |
| 000 | 002 | 00002 | |
| 000 | 003 | 00003 | |

Figure 2:
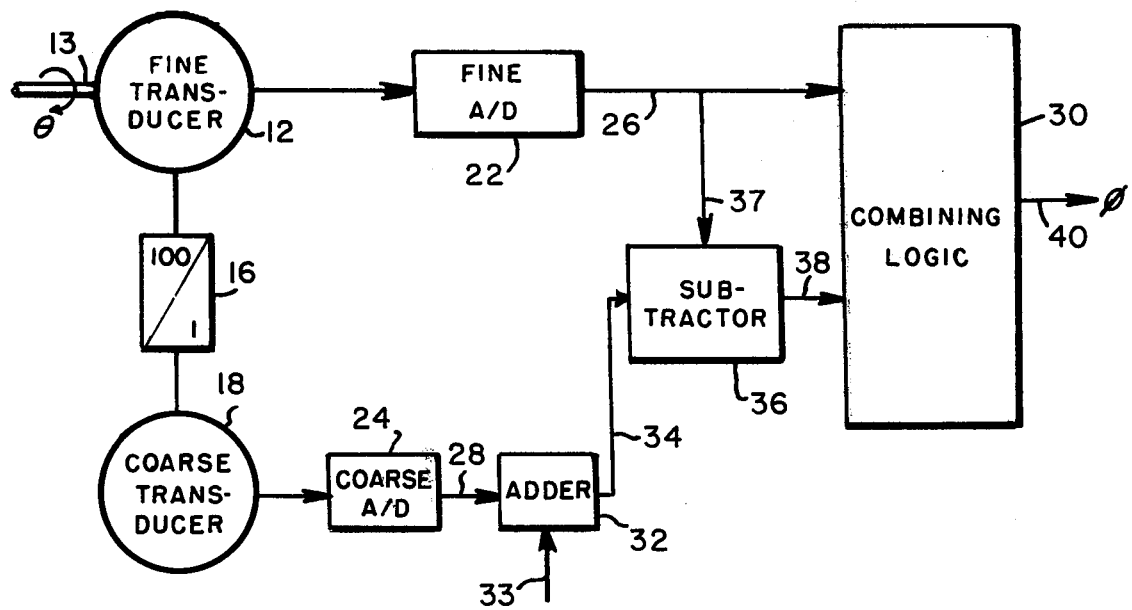
FIG. 2 is a drawing of a two-speed transducer system utilizing the teaching of the present invention.

Note that at the point where the fine digitized output goes to 0, an ambiguous error is present. This ambiguity or error possibility can be eliminated by utilizing a system constructed in accordance with the teaching of the present invention as shown in FIG. 2. Fine transducer 12 and the coarse transducer 18 provide digital signals along lines 26 and 28 from fine analog to digital converter 22 and coarse analog to digital converter 24 as explained above. Adder 32 is provided for adding a constant, such as five counts, to the coarse output digital signal provided along line 28. The five count addition can be provided along to an input line 33 to adder 32. The coarse digital signal thus supplied along line 34 has been increased by a constant number of counts.

This signal is fed to subtractor 36 which has an input 37 connected to the fine digital signal along line 26. Subtractor 36 subtracts the most significant fine digit from the modified coarse digital signal on line 34 and provides a resultant coarse digital signal along line 38 to combining output logic 30. Combining output logic 30 then provides a combined digital output, $\phi$, which utilizes the two most significant digits of the resultant coarse position signal on line 38, and all of the fine position digits supplied on line 26.

Table III shows the combined output of a two-speed system constructed in accordance with the teaching of this invention.

TABLE III

| Digitized Coarse Output LINE 28 | Digitized Fine Output LINE 26 | Shifted Coarse LINE 34 | Shifted Coarse Minus Fine MSD LINE 38 | Resultant Combined Overlapped Output $\phi$ LINE 40 |
|---|---|---|---|---|
| 999 | 995 | 004 | 995 | 99995 |
| 999 | 996 | 004 | 995 | 99996 |
| 999 | 997 | 004 | 995 | 99997 |
| 999 | 998 | 004 | 995 | 99998 |
| 999 | 999 | 004 | 995 | 99999 |
| 999 | 000 | 004 | 004 | 00000 |
| 999 | 001 | 004 | 004 | 00001 |
| 000 | 002 | 005 | 005 | 00002 |
| 000 | 003 | 005 | 005 | 00003 |

Note that the combined output provided on line 40 is the same as that supplied from an error free system having an output as shown in Table I, yet the inputs contain the same errors as illustrated in Table II. Columns 1 and 2 of Table III show the actual numerical value of the digital position signals provided along lines 28 and 26, respectively, which contain the same errors as shown in Table II. An error is illustrated by the fact that the 999 to 000 transition of the digitized fine resolver signal does not occur at the same position as the 9 to 0 transition of the least significant digitized coarse signal. This error in the prior art system as illustrated in Table II resulted in an ambiguous situation. Column 3 of Table III shows the coarse digital signal, shifted by the addition of five counts, which is present on line 34. Notice that the transition from one digit to the next digit still occurs at the same position for the coarse digital signal along line 28 and the modified digital signal on line 34. Column 4 of Table III shows the shifted coarse output signal of Column 3 minus the most significant digit of the fine output. This resultant signal along line 38 is fed to the combining logic 30. The combined output shown in Column 5 of Table III supplied along line 40 from combining logic 30 consists of the actual fine digital output combined with the two most significant digits of the resultant digital coarse signal supplied along line 38. As illustrated, the 000 to 999 transition of the resultant combined output occurs at the proper position. The resultant output signal is the same as that for an error free system whose output is as shown in Table I. The modified overlapped technique described herein will guarantee a non-ambiguous combined output as illustrated above, for situations wherein the error between the coarse and fine transducer is less than ten counts of the least significant coarse digit. The disclosed method as illustrated consists simply of: (1) shifting the coarse digital output ahead by five counts; (2) subtracting the most significant digit of the fine output from the shifted coarse; (3) combining the resultant coarse output with actual fine output. The shifting of the coarse output may be accomplished by either physically displacing the coarse transducer by five counts or simply adding five counts to the coarse output.

Every time the fine transducer completes one revolution an ambiguous error situation can be present. Table IV, V, and VI, which are similar to Tables I, II, and III, show a transition from a digital represented position of 24500 to 25400. Table IV shows an output in an errorless system.

TABLE IV

| Digitized Coarse Output LINE 28 | Digitized Fine Output LINE 26 | Combined Overlapped Output $\phi$ LINE 40 |
|---|---|---|
| 245 | 500 | 24500 |
| 246 | 600 | 24600 |
| 247 | 700 | 24700 |
| 248 | 800 | 24800 |
| 249 | 900 | 24900 |
| 250 | 000 | 25000 |
| 251 | 100 | 25100 |
| 252 | 200 | 25200 |
| 253 | 300 | 25300 |
| 254 | 400 | 25400 |

If any error exists the transition of the digitized fine output and 9 to 0 transition of the least significant coarse digit would not necessarily occur at the same position and an ambiguous situation, as illustrated in Table V could result.

TABLE V

| Digitized Coarse Output LINE 28 | Digitized Fine Output LINE 26 | Combined Overlapped Output $\phi$ LINE 40 |
|---|---|---|
| 244 | 500 | 24500 |
| 245 | 600 | 24600 |
| 246 | 700 | 24700 |
| 247 | 800 | 24800 |
| 248 | 900 | 24900 — Ambiguous |
| 249 | 000 | 24000 — Error |
| 250 | 100 | 25100 — Situation |
| 251 | 200 | 25200 |
| 252 | 300 | 25300 |
| 253 | 400 | 25400 |

Where the fine digitized output goes to 0, an error is present. The error is eliminated by utilizing the teaching of the present invention. Table VI shows the combined output, for the same signals present in Table V, of a two speed system constructed in accordance with this invention.

TABLE VI

| Digitized Coarse Output LINE 28 | Digitized Fine Output LINE 26 | Shifted Coarse LINE 34 | Shifted Coarse Minus Fine MSD LINE 38 | Resultant Combined Overlapped Output φ LINE 40 |
|---|---|---|---|---|
| 244 | 500 | 249 | 244 | 24500 |
| 245 | 600 | 250 | 244 | 24600 |
| 246 | 700 | 251 | 244 | 24700 |
| 247 | 800 | 252 | 244 | 24800 |
| 248 | 900 | 253 | 244 | 24900 |
| 249 | 000 | 254 | 254 | 25000 |
| 250 | 100 | 255 | 254 | 25100 |
| 251 | 200 | 256 | 254 | 25200 |
| 252 | 300 | 257 | 254 | 25300 |
| 253 | 400 | 258 | 254 | 25400 |

The combined output, as shown in Table VI, is the same as the error free output shown in Table IV.

What is claimed is:

1. A synchronized two-speed position indicating system comprising:
   fine position indicating means providing a high accuracy digital indication of a position over a first selected range;
   coarse position indicating means providing a lesser accuracy digital indication of a position over a second selected larger range which includes the first selected range;
   said fine position indicating means and said coarse position indicating means constructed so that the position indicated by the most significant digit of said fine position indicating means and the position indicated by the least significant digit of said coarse position indicating means overlap;
   adder means for adding a fixed number of counts to the digital output of said coarse position indicating means;
   subtractor means for subtracting the most significant digit of the fine position indicating means from the digital output of said coarse position indicating means; and,
   combining means for combining the output of said fine position indicating means and a portion of the modified output of said coarse position indicating means.

2. A synchronized two-speed position indicating system as claimed in claim 1 wherein said adder means comprises:
   means for permitting manual positioning of said coarse position indicating means.

3. A synchronized two-speed position indicating system comprising:
   fine position indicating means providing a high accuracy digital indicating of a position over a first selected range;
   coarse position indicating means providing a lesser accuracy digital indication of a position over a second selected larger range which includes the first selected range;
   said fine position indicating means and said coarse position indicating means constructed so that the position indicated by the most significant digit of said fine position indicating means and the position indicated by the least significant digit of said coarse position indicating means overlap;
   adder means for adding a fixed number of counts to the digital output of said coarse position indicating means;
   subtractor means for subtracting a variable number of counts from the digital output of said coarse position indicating means;
   combining means for combining the output of said fine position indicating means and a portion of the modified output of said coarse position indicating means;
   means for permitting manual positioning of said coarse position indicating means; and,
   said subtractor means subtracts the most significant digit of the fine position indicating means from the digital output of said coarse position indicating means.

4. A synchronized two-speed position indicating system as claimed in claim 3 wherein:
   said adder means adds five counts to the digital output of said coarse position indicating means.

5. Apparatus for providing a nonambiguous digital output indication for a shaft rotatable through a plurality of revolutions comprising:
   fine resolver means connected to the shaft providing analog shaft position information over one shaft revolution;
   coarse resolver means connected to the shaft providing analog shaft position information over a plurality of revolutions;
   fine digitizer means connected to the output of said fine resolver means providing a digital representation of the fine resolver analog position information;
   coarse digitizer means connected to the output of said coarse resolver means providing a digital representation of the coarse resolver analog position information;
   adder means connected to the output of said coarse digitizer means for adding a fixed number of counts to the digital output of said coarse digitizer means;
   subtractor means having a first input connected to the output of said adder means and a second input connected to the output of said fine digitizer means for subtracting the most significant digit of the output of said fine digitizer means from the output of said adder means; and,
   combining means for combining the outputs of said subtractor means and the output of said fine digitizer means.

6. Apparatus as claimed in claim 5 wherein:
   said adder means adds five counts to the output of said digitizer means.

7. A method for synchronizing the digitalized position output of a multispeed system having a coarse transducer and a fine transducer providing overlapped decimal digit output comprising the steps of:

first, adding a first constant number of counts to the digitalized coarse transducer output to yield a modified coarse transducer output;

second, subtracting the most significant digit of the fine transducer output from the modified coarse transducer output; and, third, combining the fine transducer output with a portion of the modified coarse transducer output obtained in the second step to obtain a nonambiguous output.

8. A method for synchronizing the digital output of a two-speed transducer position indicating system, having a coarse digital transducer and a fine digital transducer, utilizing a decade overlap of the least significant decade of the coarse digital transducer and the most significant decade of the fine digital transducer to obtain a nonambiguous digital position indication comprising the steps of:

a. shifting the coarse transducer to a predetermined position for adding a fixed number of counts to the digital output of the coarse digital transducer;

b. subtracting the most significant digit of the fine transducer output from the shifted coarse transducer output; and c. combining the resultant coarse transducer output digits which are not overlapped, obtained after step (b), with the actual fine transducer digital output.

9. A method as claimed in claim 8 wherein:
the coarse transducer output is shifted ahead by five counts.

10. A method as claimed in claim 9 wherein:
the coarse transducer output is three decades and the fine transducer output is three decades with the least significant decade of the coarse transducer overlapping the most significant decade of the fine transducer; and the coarse transducer output and the fine transducer output are combined by utilizing the two most significant decades of the resulting coarse transducer output with the three decades of the fine transducer output.

11. A method for synchronizing the decimal digital output of a multispeed position indicator having a fine position transducer which provides a decimal digital position indication and a coarse position transducer which provides a decimal digital position indication comprising the steps of:

overlapping the most significant decade of the fine transducer digital output and the least significant decade of the coarse transducer digital output;

adding to the digital coarse transducer output a fixed number of counts to provide a modified digital coarse transducer output;

subtracting the most significant decade of the digital fine transducer output from the modified digital coarse transducer output; and combining the result digital coarse transducer output obtained after the above steps and the digital fine transducer output to obtain a nonambiguous decimal digital output.

* * * * *

UNITED STATES PATENT AND TRADEMARK OFFICE
CERTIFICATE OF CORRECTION

PATENT NO. : 4,014,014
DATED : March 22, 1977
INVENTOR(S) : Donald H. Jones and Paul F. McNally It is certified that error appears in the above-identified patent and that said Letters Patent are hereby corrected as shown below:

Column 1, line 27, "resolves" should be --resolver--; line 38, "ser." should be --Ser.--.

Column 2, line 37, "at" should be --and--; line 55, "to" should be --of--.

Column 3, line 31, --indication-- should be inserted after "tion".

Column 4, line 14, --system-- should be inserted after "ducer".

Column 6, line 8, "Table" should be --Tables--.

Column 10, line 26, "result" should be --resulting--.

Signed and Sealed this

Twenty-fourth Day of May 1977

[SEAL]

Attest:

RUTH C. MASON
Attesting Officer

C. MARSHALL DANN
Commissioner of Patents and Trademarks